(12) United States Patent
Kiuchi

(10) Patent No.: US 7,675,329 B2
(45) Date of Patent: Mar. 9, 2010

(54) TRANSMITTER AND CONTROL METHOD FOR SAME

(75) Inventor: Hideki Kiuchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 396 days.

(21) Appl. No.: 11/753,413

(22) Filed: May 24, 2007

(65) Prior Publication Data

US 2007/0285169 A1    Dec. 13, 2007

(30) Foreign Application Priority Data

May 29, 2006   (JP)   ............................... 2006-148648

(51) Int. Cl.
*H03K 3/00*   (2006.01)
(52) U.S. Cl. ......................... 327/108; 327/423; 327/588
(58) Field of Classification Search ................. 327/379, 327/423, 588
See application file for complete search history.

(56) References Cited

U.S. PATENT DOCUMENTS

| | | | |
|---|---|---|---|
| 4,385,394 A * | 5/1983 | Pace | 375/257 |
| 5,036,219 A * | 7/1991 | Dingwall et al. | 327/92 |
| 5,600,216 A * | 2/1997 | Karwath et al. | 318/291 |
| 5,745,003 A * | 4/1998 | Wakimoto et al. | 327/382 |
| 5,886,563 A * | 3/1999 | Nasila | 327/423 |
| 6,605,976 B2 * | 8/2003 | Middel et al. | 327/423 |
| 6,876,231 B2 * | 4/2005 | Shimasaki | 326/91 |

FOREIGN PATENT DOCUMENTS

JP    2002-509682 A    3/2002

* cited by examiner

*Primary Examiner*—Kenneth B. Wells
(74) *Attorney, Agent, or Firm*—Sughrue Mion, PLLC

(57) ABSTRACT

A transmitter of the invention, according to a first aspect, has first and second driving circuits with reverse-current prevention elements connected between output terminals and power supply terminals, and a control circuit which controls the outputs of the first and second driving circuits, the control circuit controlling the first and second driving circuits, during a transition from a first state in which the first and second driving circuits output a first or a second logic level to a second state in which the first and second driving circuits output an intermediate level between the first and second logic levels, to induce a third state in which a through current flows in the first and second driving circuits via the reverse-current prevention elements.

11 Claims, 10 Drawing Sheets

TRANSMITTER AND CONTROL METHOD FOR SAME

BACKGROUND OF THE INVENTION

1. Field of the Invention

This invention relates to a transmitter and to a control method for a transmitter, and in particular relates to a transmitter having a bus driving circuit which outputs differential signals, and to a control method for such a circuit.

2. Description of Related Art

In automotive control technology in recent years, numerous CAN (Controller Area Networks) have been used as networks connecting the various portions of automobiles. A CAN performs data communication using differential signals on a pair of signal lines. A CAN conforms to serial bus communication standards, and signals output to signal lines are generated by transceivers. One example of such a transmitter is disclosed in National Publication of Translated Version No. 2002-509682.

Here, a circuit diagram for a general transmitter 101 used in a CAN appears in FIG. 9. As shown in FIG. 9, the transmitter 101 has a PMOS transistor Tr1 (below simply called "transistor Tr1"), an NMOS transistor Tr2 (below simply called "transistor Tr2"), reverse-current prevention elements (diodes D1 and D2), and a control circuit 103. The transmitter 101 also has a power supply terminal VDD, ground terminal GND, and output terminals CANH and CANL.

The transistor Tr1 and diode D1 are connected in series between the power supply terminal VDD and output terminal CANH. A control signal CTRL1 of control circuit 103 is input to the gate of transistor Tr1. The anode of diode D1 is connected to the drain of transistor Tr1, and the cathode is connected to output terminal CANH. On the other hand, the transistor Tr2 and diode D2 are connected in series between the ground terminal GND and output terminal CANL. A control signal CTRL2 of control circuit 103 is input to the gate of transistor Tr2. The anode of diode D2 is connected to output terminal CANH, and the cathode is connected to the drain of transistor Tr2. The output terminal CANH and output terminal CANL are connected via a load resistance RL.

The transmitter 101 controls transistors Tr1 and Tr2, by the control signals CTRL1 and CTRL2 output by control circuit 103, to pass a current through the load resistance RL. By this current, a potential difference is induced across output terminals CANH and CANL, so that the transmitter 101 outputs differential signals.

Here, a timing chart of the operation of the transmitter 101 is shown in FIG. 10; operation of the transmitter 101 is explained below. As shown in FIG. 10, the control signal CTRL1 goes to high level and control signal CTRL2 goes to low level at time T11. As a result, transistors Tr1 and Tr2 become non-conducting, and so the output terminals CANH and CANL each go to an intermediate level. In this case, data received by the receiver 102 is recessive, indicating for example the low-level state.

On the other hand, at time T12 the control signal CTRL1 goes to low level and the control signal CTRL2 goes to high level. As a result, transistors Tr1 and Tr2 enter the conducting state, and current flows from transistor Tr1 to transistor Tr2 via the load resistance RL. Due to the flow of current in the load resistance RL, output terminal CANH goes to high level and output terminal CANL goes to low level. When output terminal CANH is at higher voltage than output terminal CANL, data received by receiver 102 is dominant, indicating for example the high-level state.

It is widely known that in an automobile in which a CAN is installed, transmitted and received data signals are substantially affected by external noise. In order to enhance the reliability of data signals with respect to such external noise, data is transmitted and received over a pair of wires in a CAN. Here, operation of a transmitter when external noise is intermixed in lines is explained, referring to FIG. 10.

First, a case is explained in which, at time T13 with data signals recessive, external noise is intermixed. At time T13', external noise is intermixed equally in the line connected to output terminal CANH and in the line connected to output terminal CANL. At this time, transistors Tr1 and Tr2 are in the conducting state, so that there are approximately the same changes in potential in the output terminals CANH and CANL. Data received by receiver 102 is the potential difference between the output terminals CANH and CANL. Hence if there is no change in this potential difference, the data received by receiver 102 is not affected by external noise.

Next, a case is explained in which, at time T14 with output signals dominant, external noise is intermixed. At time T14' external noise appears in the same way in the line connected to output terminal CANH and in the line connected to output terminal CANL. At this time, transistors Tr1 and Tr2 are in the non-conducting state, so that approximately the same potential changes occur in the output terminals CANH and CANL. Data received by receiver 102 is the potential difference between the output terminals CANH and CANL. Hence if there is no change in this potential difference, the data received by receiver 102 is not affected by external noise.

On the other hand, the transmitter 101 uses diodes as reverse-current prevention elements. Diodes have a charge-storage effect in which current flows in the opposite direction for a fixed period after switching from the conducting state to the non-conducting state, due to the discharge of accumulated charge. Consequently, if external noise is intermixed such that the potential at an output terminal is higher than the power supply voltage during the occurrence of the charge storage effect at a diode, a current flowing into the transmitter 101 occurs due to the intermixing of external noise. That is, when external noise having a large positive-side amplitude is intermixed, the charge storage effect occurs at diode D1, and current flows into the transmitter 101 from output terminal CANH. The inflowing current includes current which flows in from the line connected to output terminal CANH (path A'), and current which flows in via the loading resistance RL from the line connected to output terminal CANL (path B'). At this time, when passing through path B', current flows in the load resistance RL. As a result, a potential difference occurs between output terminal CANH and output terminal CANL due to the current flowing in the load resistance RL and the load resistance RL. Due to this potential difference, signal noise occurs in data signals (time T15 in FIG. 10). In the case shown in FIG. 10, signal noise occurs below the recessive level which is the level of data signals after time T15.

The intrusion of external noise and current flowing due to the charge storage effect flow in the power supply terminal VDD via the parasitic diode formed between the drain and well of transistor Tr1 (paths A', B' in FIG. 9). Cross-sectional views of the PMOS transistor Tr1 and NMOS transistor Tr2 and of parasitic diodes appear in FIG. 11. As shown in FIG. 11, a parasitic diode is formed between the drain region 43 and the well region 42 in the PMOS transistor, and is in the conducting state when the potential difference between the drain potential and the power supply voltage exceeds the threshold of the parasitic diode. A parasitic diode is also formed between the drain region 47 and the well region 41 in the NMOS transistor, and is in the conducting state when the potential difference between the drain potential and the ground potential exceeds the parasitic diode threshold.

In an example of the related art, signal noise occurring in data signals attains a level greater than the difference between the recessive level and the threshold level or than the difference between the dominant level and the threshold level. This does not result in erroneous data recognition by the receiver 102. Hence even when signal noise occurs in data signals in a CAN due to a diode charge storage effect, there is no effect on data transmission and reception. Thus in a CAN which uses a pair of signal lines to transmit and receive signals using the potential differences of differential signals, the reliability of data signals is enhanced.

On the other hand, the FlexRay standard, which faster data communication speeds than in ordinary CAN, is currently being studied as a next-generation CAN standard. A CAN is a standard for event-triggered communication, in which the various circuits operate based on transmitted and received commands; FlexRay is a standard for time-triggered communication, in which the various circuits execute commands with prescribed timing. Hence whereas in a CAN there is no need to create a state with no data while data is not being transmitted and received, in a FlexRay system, states with no data must be created while data is not being transmitted or received. Consequently, whereas in a CAN data signals are transmitted and received using the two values of dominant and recessive, in a FlexRay system data signals are communicated using three values, which are for example Data1 indicating high level, Data0 indicating low level, and Idle indicating an intermediate level. Here, Idle is used as a value indicating a state with no data.

In FlexRay systems also, transmitters using reverse-current prevention elements such as diodes in bus driving circuits are generally employed. Transmitters used in FlexRay systems create an Idle state by not passing current in the bus driving circuit. Hence when making a transition from a Data1 or Data0 state to the Idle state, if external noise is intermixed while the charge storage effect is occurring in the diode, signal noise occurs in data signals.

In a CAN system, as explained above, the effects of this signal noise are not a problem. However, in a FlexRay system, Idle is an intermediate voltage, and thresholds higher and lower than this are provided, with Data1 at or above the higher threshold and Data0 at or below the lower threshold, so that when the Idle signal level exceeds a threshold due to this noise, there is the problem that the receiver may erroneously recognize the Idle state as Data1 or as Data0.

Hence in a transmitter which transmits three-valued signals such as in the case of FlexRay, even when diodes or similar are used as transmitter reverse-current prevention elements, it is desirable that measures be taken to prevent erroneous recognition of signals by the receiver.

SUMMARY

In one embodiment, there is provided a transmitter including first and second driving circuits with reverse-current prevention elements connected between output terminals and power supply terminals; and a control circuit which controls output of the first and second driving circuits, wherein the control circuit controls the first and second driving circuits, during a transition from a first state in which the first and second driving circuits output a first or a second logic level to a second state in which the first and second driving circuits output an intermediate level between the first and second logic levels, to induce a third state in which a through current flows in the first and second driving circuits via the reverse-current prevention elements. Moreover, other aspects of a transmission current of this invention are described in the embodiments of this Specification and elsewhere.

This transmitter of this invention can pass a reverse current, occurring due to the charge storage effect and to external noise intermixing, equally through the first driving current and the second driving current, by inducing an equal current-passing state prior to inducing a non-conducting state in a reverse-current prevention element (for example, a diode). By this means, even when a load resistance is connected between the outputs of the first and second driving circuits, no current flows in the load resistance, and there is no change in the potential difference of the output signals of the first and second driving circuits. Hence data signals are not affected by external noise. That is, by a transmitter of this invention, the imperviousness of data signals to external noise can be enhanced.

In another embodiment, there is provided a method of controlling a transmitter which includes: a first driving circuit in which a first current setting circuit and first reverse-current prevention element are connected in series between an output terminal and a first power supply and in which a second current setting circuit and a second reverse-current prevention element are connected in series between the output terminal and a second power supply; and a second driving circuit in which a third current setting circuit and third reverse-current prevention element are connected in series between an output terminal and the first power supply and in which a fourth current setting circuit and a fourth reverse-current prevention element are connected in series between the output terminal and the second power supply, and is a method having the step of executing control, during a transition from a first state in which either the first and fourth current setting circuits or the second and third current setting circuits output a current, to a second state in which the first through fourth current setting circuits do not output a current, to induce a third state in which the first through fourth current setting circuits output a prescribed current.

This transmitter control method is a method of inducing an equal current-passing state prior to inducing non-conducting states in the first through fourth reverse-current prevention elements (for example, diodes). By the first through fourth reverse-current prevention elements, reverse currents due to the charge storage effect and intrusion of external noise can be passed equally in the first driving circuit and in the second driving circuit. That is, there is no current flowing in the load resistance connected between the first and second driving currents due to the intrusion of external noise, and data signals due to differential signals output by the first and second driving circuits are not affected by external noise.

By a transmitter and a transmitter control method of this invention, noise in data signals arising from the charge storage effect and from external noise intrusion can be suppressed, and data signal reliability can be improved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Fist Embodiment

Figure 1:
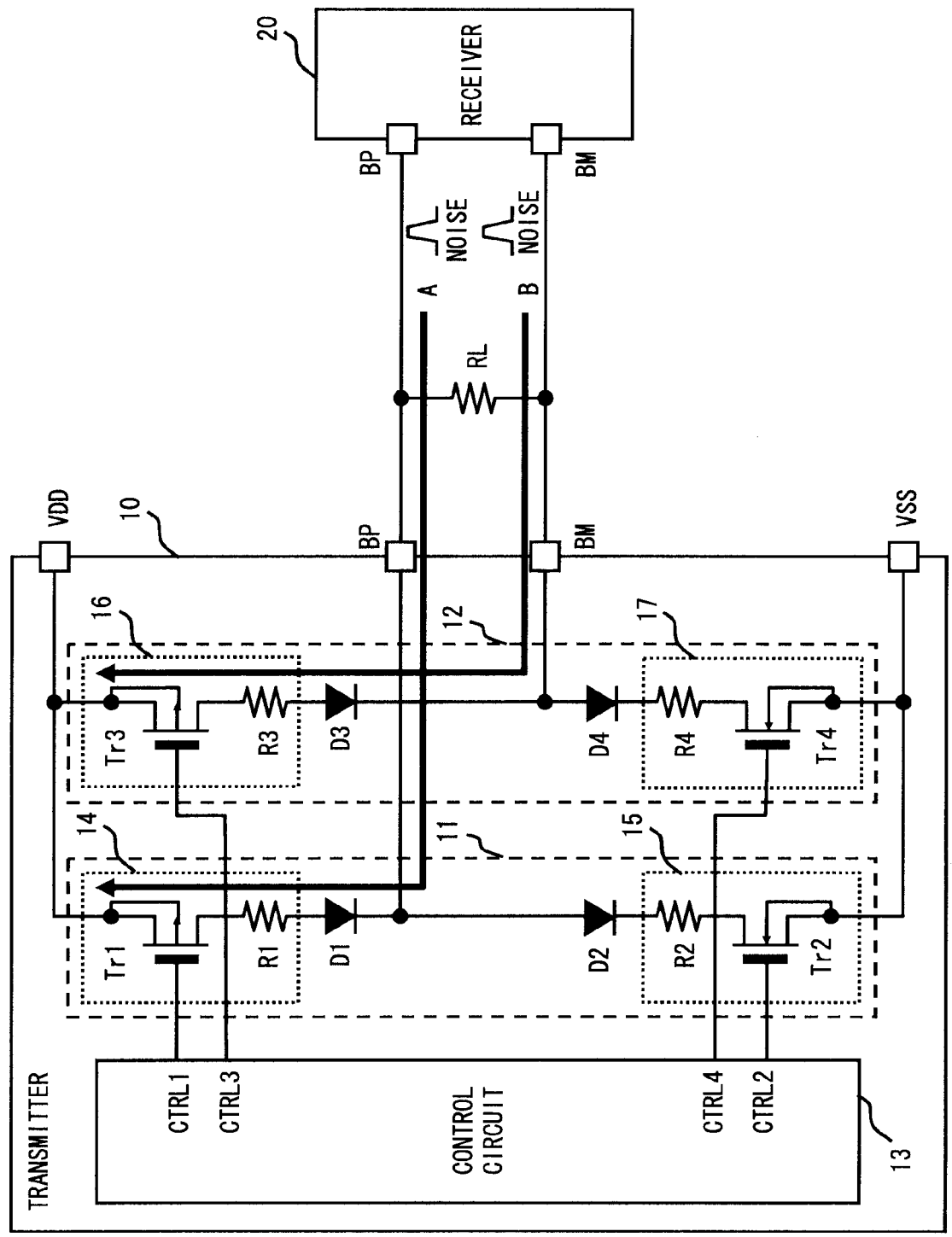
FIG. 1 is a circuit diagram of the transmitter of a first embodiment.

Below, embodiments of the invention are explained referring to the drawings. The transmitter of a first embodiment is a circuit which performs transmission and reception using three-valued data signals, such as in circuits which perform communications based for example on the FlexRay standard. FIG. 1 shows a circuit diagram of a transmitter 10 according to the first embodiment. In FIG. 1, a receiver 20 which receives signals output by the transmitter 10, and a load resistance RL connecting a pair of data lines, are shown. The transmitter 10 generates a potential difference across the load resistance RL, and the receiver 20 receives data based on this potential difference.

The transmitter 10 has a power supply terminal VDD, ground terminal VSS, and first and second output terminals (for example, output terminals BP and BM). The receiver 20 has input terminals BP, BM corresponding to the output terminals BP, BM of the transmitter 10. In the following explanation, the line connected between the output terminal BP of the transmitter 10 and the input terminal BP of the receiver 20 is called data line BP, and the line connected between the output terminal BM of the transmitter 10 and the input terminal BM of the receiver 20 is called data line BM.

The transmitter 10 has first and second driving circuits (for example, driving circuits 11, 12) and a control circuit 13. Driving circuit 11 has a first current setting circuit (for example, current setting circuit 14), a second current setting circuit (for example, current setting circuit 15), and first and second reverse-current prevention elements (for example, diodes D1, D2). The current setting circuit 14 outputs a current of prescribed preset amount according to a control signal CTRL1 output by the control circuit 13. The current setting circuit 15 takes in a current of prescribed preset amount according to a control signal CTRL2 output by the control circuit 13.

The driving circuit 11 comprises current setting circuits 14, 15 connected in series between the power supply terminal VDD and ground terminal VSS. Between the current setting circuits 14, 15, diodes D1 and D2 are connected in series. The connection point between the diodes D1 and D2 is connected to the output terminal BP.

The driving circuit 12 comprises the third current setting circuit (for example, current setting circuit 16) and fourth current setting circuit (for example, current setting circuit 17), and third and fourth reverse-current prevention elements (for example, diodes D3 and D4). The current setting circuit 16 outputs a current of prescribed preset amount according to a control signal CTRL3 output by the control circuit 13. The current setting circuit 17 takes in a current of prescribed preset amount according to a control signal CTRL4 output by the control circuit 13.

The driving circuit 12 comprises current setting circuits 16, 17 connected in series between the power supply terminal VDD and ground terminal VSS. Between the current setting circuits 16, 17, diodes D3 and D4 are connected in series. The connection point between the diodes D3 and D4 is connected to the output terminal BM.

The current setting circuits 14 to 17 are explained in detail. The current setting circuit 14 has a PMOS transistor Tr1 (hereafter simply called "transistor Tr1") and a current-adjusting resistance (for example, resistance R1). The control signal CTRL1 output by the control circuit 13 is input to the gate of transistor Tr1. The source of transistor Tr1 is connected to power supply terminal VDD, and the drain is connected to one end of resistance R1. The other end of resistance R1 is connected to the anode of diode D1.

The current setting circuit 15 has an NMOS transistor Tr2 (hereafter simply called "transistor Tr2") and a current-adjusting resistance (for example, resistance R2). The control signal CTRL2 output by the control circuit 13 is input to the gate of transistor Tr2. The source of transistor Tr2 is connected to ground terminal VSS, and the drain is connected to one end of resistance R2. The other end of resistance R2 is connected to the cathode of diode D2.

The current setting circuit 16 has a PMOS transistor Tr3 (hereafter simply called "transistor Tr3") and a current-adjusting resistance (for example, resistance R3). The control signal CTRL3 output by the control circuit 13 is input to the gate of transistor Tr3. The source of transistor Tr3 is connected to power supply terminal VDD, and the drain is connected to one end of resistance R3. The other end of resistance R3 is connected to the anode of diode D3.

The current setting circuit 17 has a PMOS transistor Tr4 (hereafter simply called "transistor Tr4") and a current-adjusting resistance (for example, resistance R4). The control signal CTRL4 output by the control circuit 13 is input to the gate of transistor Tr4. The source of transistor Tr4 is connected to ground terminal VSS, and the drain is connected to one end of resistance R4. The other end of resistance R4 is connected to the cathode of diode D4.

When transistor Tr1 and transistor Tr4 are in the conducting state, current flows via the load resistance RL from transistor Tr1 to transistor Tr4. The voltage across the output terminals BP and BM is determined by the amount of current flowing in the load resistance RL and the resistance value of the load resistance RL. On the other hand, when transistors Tr2 and Tr3 are in the conducting state, current flows via the load resistance RL from transistor Tr3 to transistor Tr2. The voltage across output terminals BP, BM is determined based on the amount of current flowing in load resistance RL and the resistance value of the load resistance RL.

The amount of current flowing in the load resistance RL is determined by the on-resistances of transistors Tr1, Tr4 and the resistance values of resistances R1, R4, RL; but by making the resistance values of resistances R1 and R4 higher than the transistor on-resistances and the load resistance RL, adjustment is effectively possible through the resistance values of resistances R1 and R4. It is also possible to perform adjustment by changing the on-resistances of transistors Tr1 and Tr4, without using the resistances R1 and R4 to set the current amount. Specifically, with for example the transistor gate lengths held constant, by narrowing the gate widths the transistor sizes can be changed, and the on-resistance values can be adjusted. In this case, the above resistances R1 to R4 are not necessary.

Figure 2:
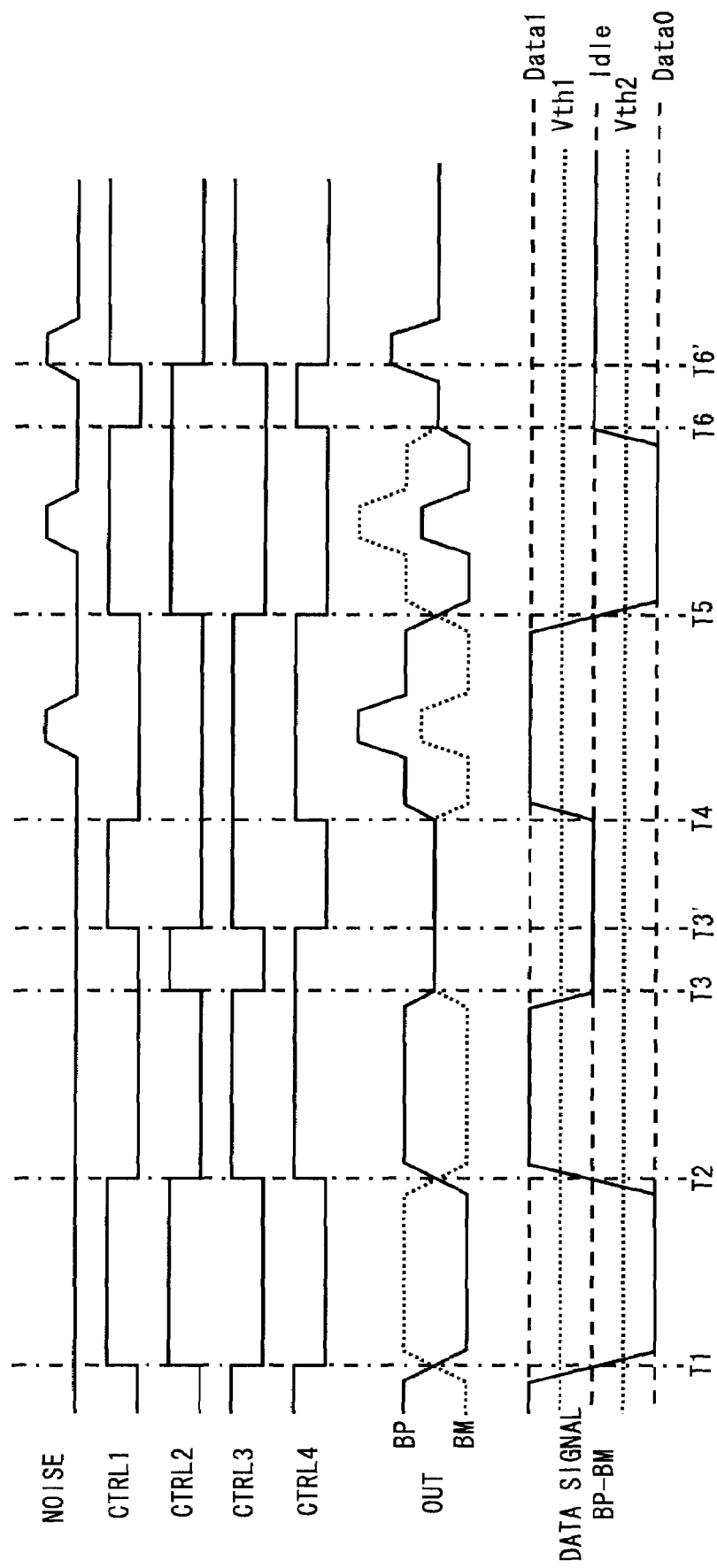
FIG. 2 shows the timing chart of the transmitter of the first embodiment.

Here, FIG. 2 is a timing chart of the operation of transmitter 10; the operation of transmitter 10 is explained referring to FIG. 2. In this embodiment, the state in which the transistors Tr1 and Tr4 are in the conducting state and output data signals are at the first logic level (for example, Data1), or the state in which transistors Tr2 and Tr3 are in the conducting state and output data signals are at the second logic level (for example, Data0) is called the first state. The state in which transistors Tr1 to Tr4 are in the non-conducting state, and output data signals are at the intermediate level (for example, Idle), is called the second state.

First, the period in which transmitter 10 outputs Data0 between times T1 and T2 is explained. When the control signals CTRL1, CTRL2 go to high level at time T1, transistor Tr1 enters the non-conducting state, and transistor Tr2 enters the conducting state. When control signals CTRL3 and CTRL4 go to low level, transistor Tr3 enters the conducting state, and transistor Tr4 enters the non-conducting state. As a result, current flows via the load resistance RL from transistor Tr3 to transistor Tr2, the output terminal BP goes to low level, and the output terminal BM goes to high level. At this time, subtracting the output of output terminal BM from the voltage of output terminal BP results in a negative voltage, and when this negative voltage falls below the threshold Vth2 of Data0, the receiver 20 recognizes the data as Data0.

Next, the period in which transmitter 10 outputs Data1 between times T2 and T3 is explained. When the control signals CTRL1, CTRL2 go to low level at time T2, transistor Tr1 enters the conducting state, and transistor Tr2 enters the non-conducting state. When control signals CTRL3 and CTRL4 go to high level, transistor Tr3 enters the non-conducting state, and transistor Tr4 enters the conducting state. As a result, current flows via the load resistance RL from transistor Tr1 to transistor Tr4, the output terminal BP goes to high level, and the output terminal BM goes to low level. At this time, subtracting the output of output terminal BM from the voltage of output terminal BP results in a positive voltage, and when this positive voltage exceeds the threshold Vth1 of Data1, the receiver 20 recognizes the data as Data1.

Next, the period in which transmitter 10 outputs Idle from time T3 to time T4 is explained. The transmitter 10 of this embodiment sets all the transistors Tr1 to Tr4 to the conducting state at once when making a transition from Data1 or Data0 to Idle (for example, the third state in this embodiment). Then, all the transistors Tr1 to Tr4 are put into the non-conducting state (for example, the second state in this embodiment). As a result, transmitter 10 operates so as to output Idle.

First, when the control signals CTRL1 and CTRL3 go to low level at time T3, transistors Tr1 and Tr3 enter the conducting state, and when control signals CTRL2 and CTRL4 go to high level, transistors Tr2 and Tr4 enter the conducting state. As a result, through currents flow in driving circuits 11 and 12 from power supply terminal VDD to ground terminal VSS, and diodes D1 to D4 enter the conducting state. Because no current flows in the load resistance RL, output terminals BP and BM are both at an intermediate potential. The time from time T3 to time T3' can be set to an arbitrary value; for example, the time can be set to several nsec. The current amount of the through current flowing in driving circuit 11 is set based on the sum of the resistances R1 and R2, and the current amount of the through current flowing in driving circuit 12 is set based on the sum of resistances R3 and R4.

Then, at time T3' after a prescribed time has elapsed from time T3, control signals CTRL1 and CTRL3 are set to high level, and transistors Tr1 and Tr3 enter the non-conducting state. Also, control signals CTRL2 and CTRL4 go to low level, and transistors Tr2 and Tr4 enter the non-conducting state. By this means, diodes D1 to D4 enter the non-conducting state. Also, because no current flows in the load resistance RL, output terminals BP and BM are both at an intermediate potential.

On the other hand, operation when external noise is intermixed into the data lines is explained. First, the case in which data in data lines is Data1 or Data0 is explained. In this case, the potentials in data lines BP, BM are set by the driving circuits 11 and 12, so that the potentials in data lines BP, BM change substantially the same way in response to intermixed external noise (FIG. 2, times T4 to T6). Hence there is no effect on the data signal, defined based on the potential difference between data lines BP and BM.

The case of external noise intrusion when the data signal makes a transition from Data1 or Data0 to Idle is explained. In this embodiment, as explained above, when making a transition from Data1 or Data0 to Idle, the transistors Tr1 to Tr4 are all put into the conducting state at once, and the diodes D1 to D4 are all put into the conducting state. That is, during the period in which transistors Tr1 to Tr4 are all in the conducting state, driving circuits 11 and 12 are in the same state, and the effect due to external noise intermixed in the data lines BP, BM is substantially the same, and no current flows in the load resistance RL, so that signal noise does not occur in the data signal.

Further, when at time T6' in FIG. 2 the transistors Tr1 to Tr4 make the transition from conducting state to non-conducting state, the charge storage effect occurs at the diodes. When external noise is intermixed in the data lines at this time T6', the current in data line BP due to the charge storage effect and intermixing of external noise flows via the diode D1 and transistor Tr1 of driving circuit 11 to power supply terminal VDD. And, when current flows in data line BM due to the charge storage effect and intermixing of external noise, the current in data line BM due to the charge storage effect and intermixing of external noise flows via the diode D3 and transistor Tr3 of driving circuit 12 to power supply terminal VDD. That is, the current due to the charge storage effect and to intermixing of external noise flows in the same way in different paths, so that no current flows in the load resistance RL. Hence there is no change in the potential difference between data lines BP and BM, and so there is no effect of signal noise on the data signal.

Here, the operation when, during a transition from Data1 or Data0 to Idle, the charge storage effect occurs in one of the driving circuits is explained. When no period is provided to pass through currents in both the driving circuits during a transition from Data1 or Data0 to Idle, the charge storage effect occurs only in one driving circuit. In this case, the current arising due to intermixing of external noise and the charge storage effect flows in the driving circuit in which the charge storage effect occurs. Hence current flows from the line connected to the driving circuit in which the charge storage effect occurs, via the load resistance RL, into the driving circuit in which the charge storage effect does not occur. At this time, a potential difference appears across the ends of the load resistance RL. This potential difference appears as signal noise when a data signal occurs. When this noise is strong, the receiver 20 may erroneously recognize the data signal.

On the other hand, in the transmitter of this embodiment, the charge storage effect in the diodes which are necessary as reverse-current prevention elements is induced equally in the driving circuits 11 and 12. As a result, even when external noise is intermixed at the time of a transition of diodes from the conducting state to the non-conducting state, the current arising due to the charge storage effect and the intermixing of external noise flows equally in the driving circuits connected to the data lines. Hence no current flows in the load resistance RL, and the potential difference between the data lines is maintained, so that signal noise does not occur in the data signal.

Second Embodiment

Figure 3:
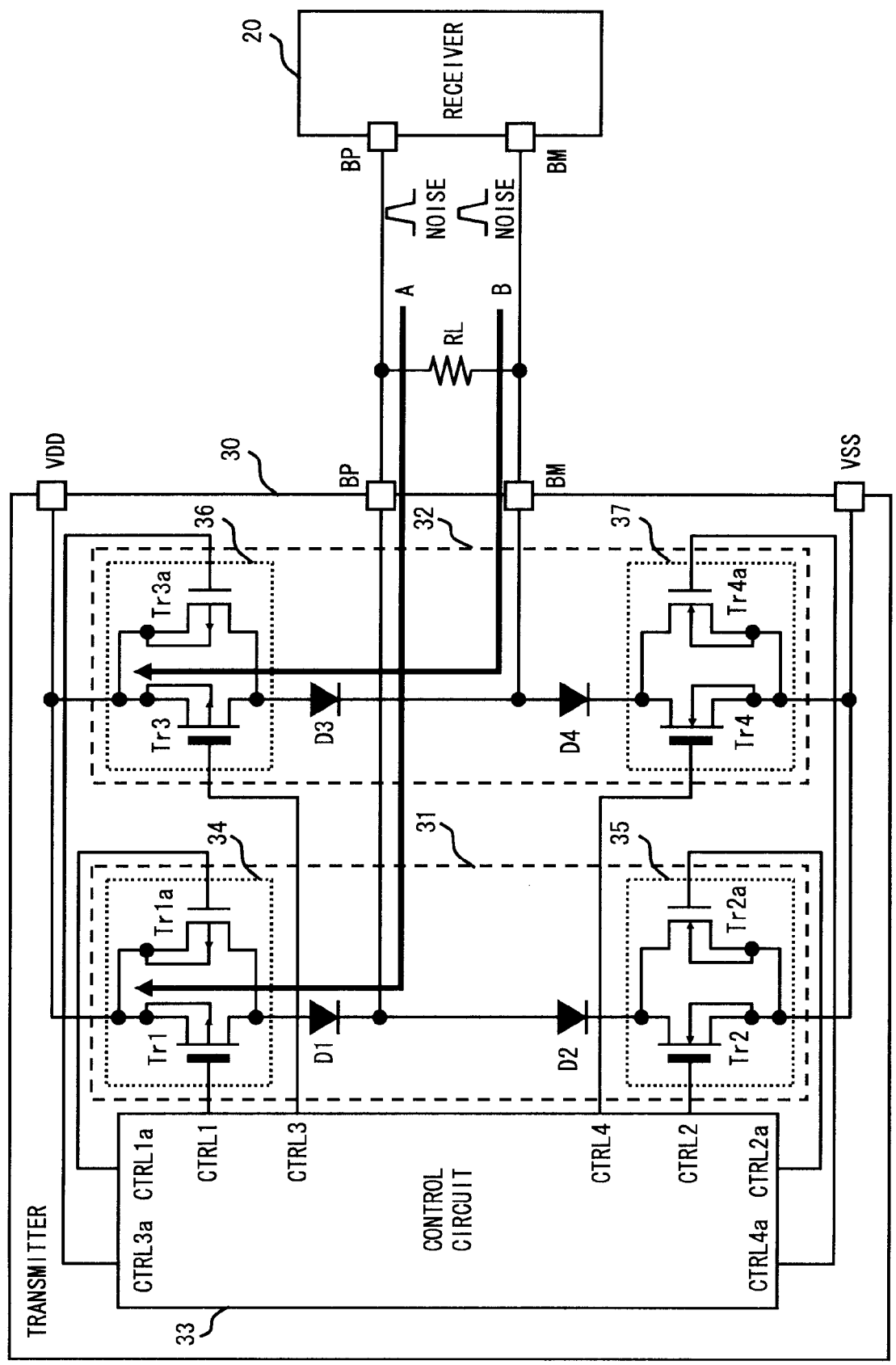
FIG. 3 is a circuit diagram of the transmitter of a second embodiment.

A circuit diagram of the transmitter 30 of a second embodiment appears in FIG. 3. The current setting circuits 14 to 17 in the transmitter 10 of the first embodiment set, by means of the resistances R1 to R4, the current flowing in the load resistance RL, the voltages at the output terminals BP and BM, and the through currents when all the transistors Tr1 to Tr4 were in the conducting state. On the other hand, the current setting circuits 34 to 37 in the transmitter 30 of the second embodiment use the transistor sizes of the transistors Tr1 to Tr4 to set the current flowing in the load resistance RL and the voltages at the output terminals BP and BM, and use the transistor sizes of transistors Tr1$a$ to Tr4$a$ to set the through currents. Portions which are common to the first embodiment and to the second embodiment are assigned the same symbols, and explanations are omitted.

The transmitter 30 has first and second driving circuits (for example, driving circuits 31, 32) and a control circuit 33. The driving circuits 31, 32 are circuits equivalent to driving circuits 11, 12 in the first embodiment, and have current setting circuits 34 to 37 as circuits equivalent to the current setting circuits 14 to 17 in the first embodiment.

The current setting circuit 34 has a PMOS transistor Tr1 (hereafter simply called "transistor Tr1") and a PMOS transistor Tr1$a$ (hereafter simply called "transistor Tr1$a$"). Transistors Tr1 and Tr1$a$ are connected in parallel. The sources of transistors Tr1 and Tr1$a$ are connected to the power supply terminal VDD, and the drains are connected to the anode of diode D1. A control signal CTRL1 from the control circuit 33 is input to the gate of transistor Tr1, and a control signal CTRL1$a$ from control circuit 33 is input to the gate of transistor Tr1$a$.

The current setting circuit 35 has an NMOS transistor Tr2 (hereafter simply called "transistor Tr2") and an NMOS transistor Tr2$a$ (hereafter simply called "transistor Tr2$a$"). Transistors Tr2 and Tr2$a$ are connected in parallel. The sources of transistors Tr2 and Tr2$a$ are connected to the ground terminal VSS, and the drains are connected to the cathode of diode D2. A control signal CTRL2 from the control circuit 33 is input to the gate of transistor Tr2, and a control signal CTRL2$a$ from control circuit 33 is input to the gate of transistor Tr2$a$.

The current setting circuit 36 has a PMOS transistor Tr3 (hereafter simply called "transistor Tr3") and a PMOS transistor Tr3$a$ (hereafter simply called "transistor Tr3$a$"). Transistors Tr3 and Tr3$a$ are connected in parallel. The sources of transistors Tr3 and Tr3$a$ are connected to the power supply terminal VDD, and the drains are connected to the anode of diode D3. A control signal CTRL3 from the control circuit 33 is input to the gate of transistor Tr3, and a control signal CTRL3$a$ from control circuit 33 is input to the gate of transistor Tr3$a$.

The current setting circuit 37 has an NMOS transistor Tr4 (hereafter simply called "transistor Tr4") and an NMOS transistor Tr4$a$ (hereafter simply called "transistor Tr4$a$"). Transistors Tr4 and Tr4$a$ are connected in parallel. The sources of transistors Tr4 and Tr4$a$ are connected to the ground terminal VSS, and the drains are connected to the cathode of diode D4. A control signal CTRL4 from the control circuit 33 is input to the gate of transistor Tr4, and a control signal CTRL4$a$ from control circuit 33 is input to the gate of transistor Tr4$a$.

Here, the on-resistances of transistors Tr1 to Tr4 are set so as to enable output of a current at which the potential difference appearing due to current flowing in the load resistance RL satisfies a prescribed value (for example, a specification value for a product). The on-resistances of transistors Tr1$a$ to Tr4$a$ are set larger than those of transistors Tr1 to Tr4, in order to make the through currents the required minimum.

Figure 4:
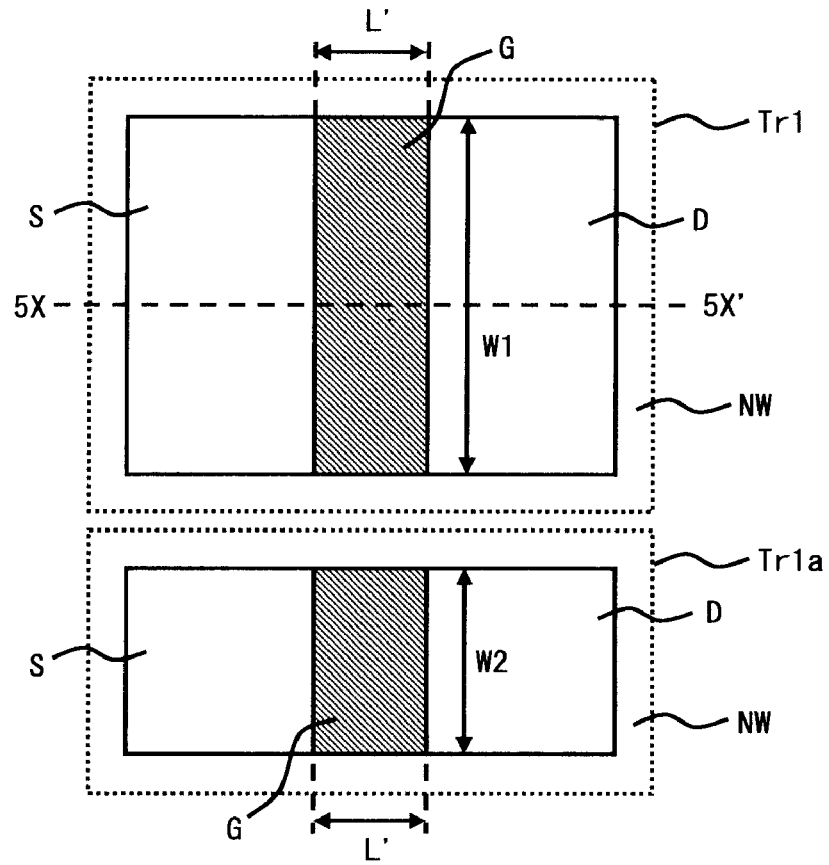
FIG. 4 is a summary view of a plane layout of transistors in the second embodiment.
Figure 5:
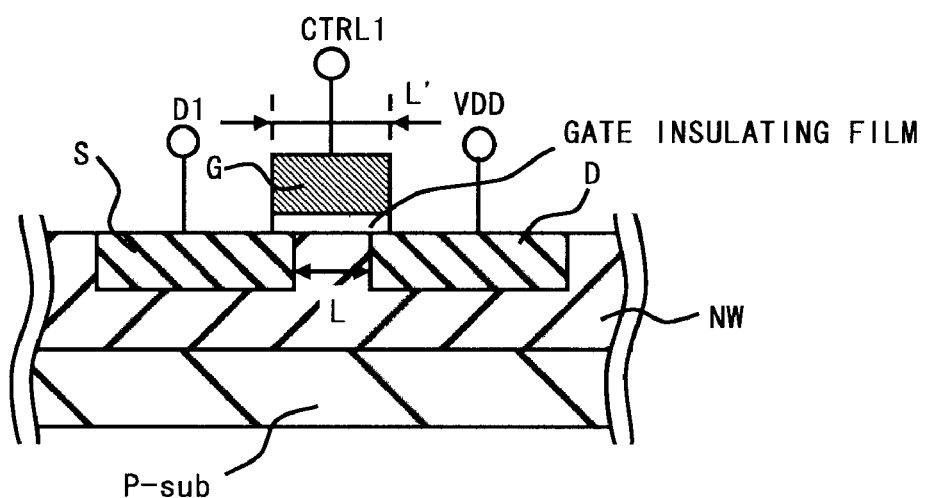
FIG. 5 is a cross-sectional view along the 5X-5X' cross-section of the plane layout in FIG. 4.

The on-resistance settings for these transistors are explained in detail. A transistor on-resistance can be set based on the ratio of the gate length to the gate width. For example, for transistors with the same gate length, the transistor with the larger gate width will have a lower on-resistance. Taking transistor Tr1 and transistor Tr1$a$ as examples, the transistor on-resistance is explained more specifically. FIG. 4 is a summary diagram of the plane layout of transistor Tr1 and transistor Tr1$a$. FIG. 5 is a cross-sectional view of transistor Tr1 along the cross-section indicated by 5X-5X' in the summary diagram of the plane layout in FIG. 4. Because the summary diagrams in FIG. 4 and FIG. 5 are used to explain the relation of the gate length and gate width of a transistor to the transistor on-resistance, gate insulating film and other components are omitted.

As shown in FIG. 4, the transistor Tr1 and transistor Tr1$a$ both have an N well region NW, source region S, drain region D, and gate electrode G. Although not shown, a gate insulating film is formed at the lower portion of the gate electrodes G. In both transistors Tr1 and Tr1$a$, the source region S and drain region D are formed adjacently, with the gate electrode G intervening. And, an N well region NW is formed surrounding the gate electrode G, source region S, and drain region D. Here, the source regions S are regions connected to the cathode of diode D1 in the cases of the transistors Tr1 and Tr1$a$. The drain regions D of the transistors Tr1 and Tr1$a$ are connected to the power supply terminal VDD.

FIG. 5 is a summary cross-sectional view of FIG. 4. In transistor Tr1, the N well region NW is formed on the substrate region P-sub. A source region S and drain region D are formed selectively on the upper layer of the N well region NW. In the upper layer of an N well region NW comprising a portion of the source region S and a portion of the drain region D is formed a gate electrode G, with a gate insulating film intervening. The gate length L is shown in FIG. 5. The gate length L is generally the distance between the source region S and the drain region D below the gate insulating film. The gate length L and the cross-sectional structure in this direction are the same for both transistors Tr1 and Tr1$a$ in FIG. 4, and so the cross-sectional view shows only transistor Tr1.

FIG. 4 is used to explain the on-resistance. In general, the transistor on-resistance is substantially proportional to the ratio of the gate length L to the gate width W (L/W), if the gate voltage, transistor manufacturing method, and other parameters are the same. Here the gate width W is in the direction substantially perpendicular to the gate length L, and may be regarded as the width of the line in which the current flows. The gate length L shown in FIG. 5 changes depending on the configuration of the active layer, and so is difficult to grasp. Hence in the following, a summary explanation is given in terms of the distance L' between the edge of the gate electrode G in contact with the source region S and the edge in contact with the drain region D, as shown in FIG. 5 and FIG. 4. In this embodiment, the gate electrode G is formed in a rectangular shape, and the length of the portion in contact with the gate electrode G and gate insulating film and the length of the upper portion are substantially the same; but when this is not the case, more accurately, the gate length L' is the length of the portion in contact with the gate electrode and the gate insulating film. As shown in FIG. 5, the gate length L' is normally somewhat longer than the gate length L. Although depending on the device design criteria, in general the difference is a factor of approximately 1.2 to 1.5. Further, normally in a single device the value of the gate length L' and the value of the gate length L are in a substantially proportional relation. That is, the gate length L' can be compared with the gate length L and with the gate width W, and so for simplicity of explanation, below in this Specification, the gate length L' is called the "comparative gate length". Hence even when using this comparative gate length L' to discuss the on-resistance, in a given device, the value of the on-resistance is substantially proportional to L'/W.

Hence the length of the gate electrode G in the direction substantially perpendicular to the comparative gate length L' is the gate width W. In the example shown in FIG. 4, transistors Tr1 and Tr1a have the same comparative gate length L'. On the other hand, the gate width W2 of transistor Tr1a is shorter than the gate width W1 of transistor Tr1. Hence the ratio L'/W2 of the comparative gate length to the width of transistor Tr1a, L'/W2, is larger than the ratio of the comparative gate length to the gate width W1 of transistor Tr1, L'/W1. That is, the on-resistance value of transistor Tr1a is larger than the on-resistance value of transistor Tr1.

Figure 6:
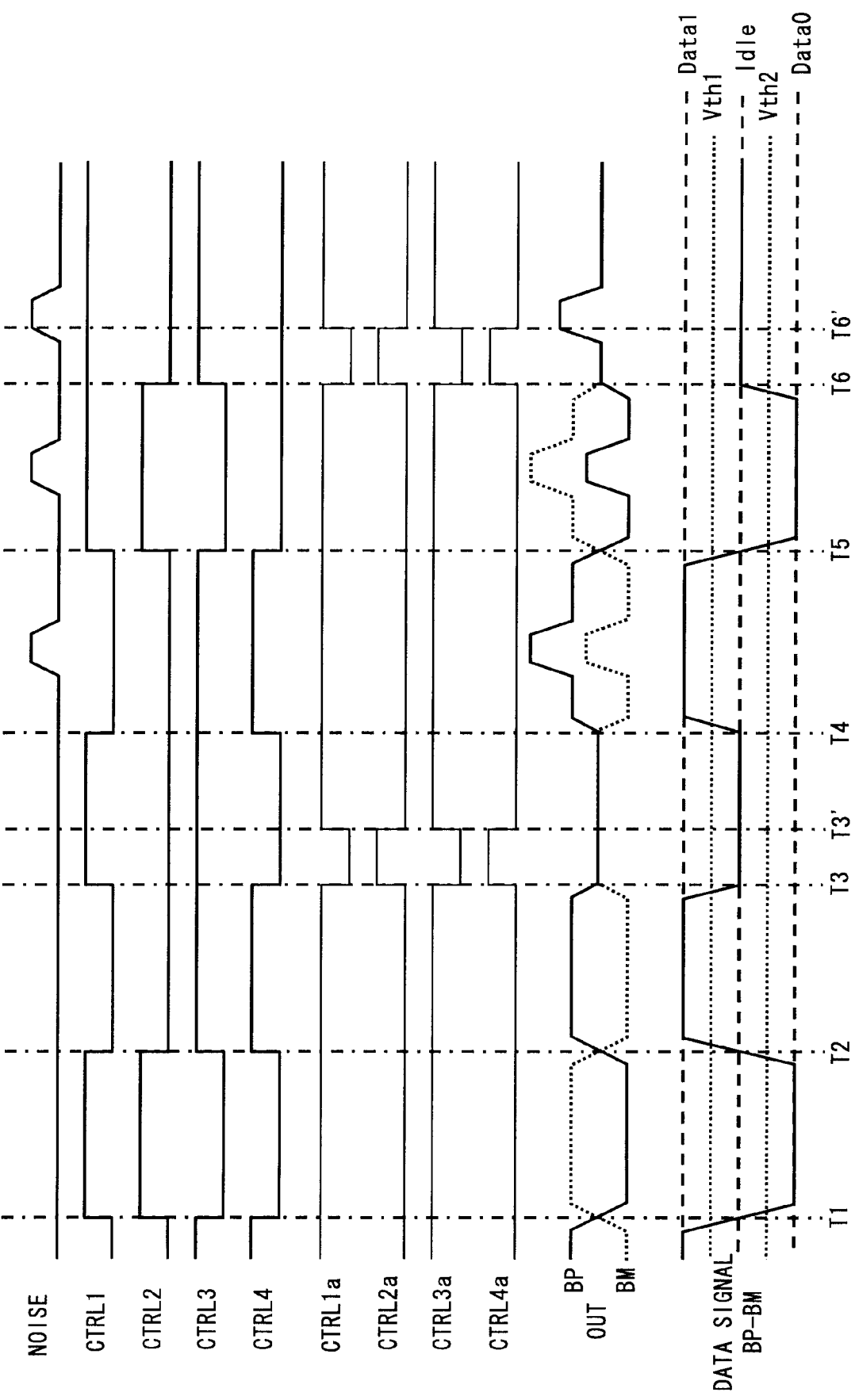
FIG. 6 shows the timing chart of the transmitter of the second embodiment.

Here, FIG. 6 shows a timing chart of the output signals and the control signals CTRL1 to CTRL4 and CTRL1a to CTRL4a, used to explain operation of the transmitter 30. First, operation of control signals CTRL1 to CTRL4 during the period between times T1 to T3 is the same as in the first embodiment, and so an explanation is omitted. On the other hand, in the period between times T1 to T3, control signals CTRL1a and CTRL3a go to high level, while control signals CTRL2a and CTRL4a go to low level. As a result, transistors Tr1a to Tr4a enter the non-conducting state.

Next, when between times T3 and T4 the output signal enters the Idle state, control signals CTRL1 and CTRL3 go to high level and control signals CTRL2 and CTRL4 go to low level. As a result, transistors Tr1 to Tr4 enter the non-conducting state. On the other hand, transistors Tr1a to Tr4a are in the conducting state during the prescribed period between times T3 and T3' (a third state in this embodiment), and enter the non-conducting state in the period between times T3' to T4 (a second state in this embodiment). That is, control signals CTRL1a and CTRL3a are at low level in the period between times T3 and T3', and are at high level in the period between times T3' and T4. Control signals CTRL2a and CTRL4a are at high level in the period between times T3 and T3', and are at low level in the period between times T3' and T4.

As a result, in the period between times T3 and T3', through currents flow in diodes D1 to D4 according to the on-resistances of transistors Tr1a to Tr4a, and thereafter the diodes D1 to D4 enter the non-conducting state. The control signals in the period between times T4 and T6' perform operations similar to between times T1 and T3'.

Here, operation is explained for a case in which noise from outside is intermixed at time T6' when all transistors are in the non-conducting state. In this case also, during the period between times T6 and T6' through currents flow in diodes D1 to D4 according to the on-resistances of transistors Tr1a to Tr4a. Consequently, similarly to the first embodiment, a charge storage effect of approximately the same magnitude occurs in diodes D1 and D3. Hence the current which flows due to the noise and the charge storage effect flows equally in driving circuits 31 and 32, and so no current flows in the load resistance RL. That is, there is no change in the potential difference between output terminals BP and BM, and so no signal noise appears in the data signal.

From the above explanation, in the transmitter of the second embodiment also, similarly to the first embodiment, it is possible to suppress signal noise in data signals due to intermixing of external noise and the charge storage effect. Further, in the transmitter 30 of the second embodiment, the transistors Tr1a to Tr4a, with transistor sizes smaller than those of transistors Tr1 to Tr4, are used to set the through currents which are passed in order to induce equal charge storage effects in diodes D1 to D4. That is, in transmitter 30 of the second embodiment, through current amounts can be made smaller than in the first embodiment. As a result, the transmitter 30 of the second embodiment is capable of lower power consumption and less heat dissipation than the transmitter 10 of the first embodiment.

In the second embodiment also, it is possible to use resistances to set the currents. When setting resistance values through the ratio of the gate length to the gate width of transistors, scattering in manufacturing conditions may result in large scattering in the on-resistances of transistors. In such cases, it is preferable that resistances be used to adjust current amounts.

Figure 7:
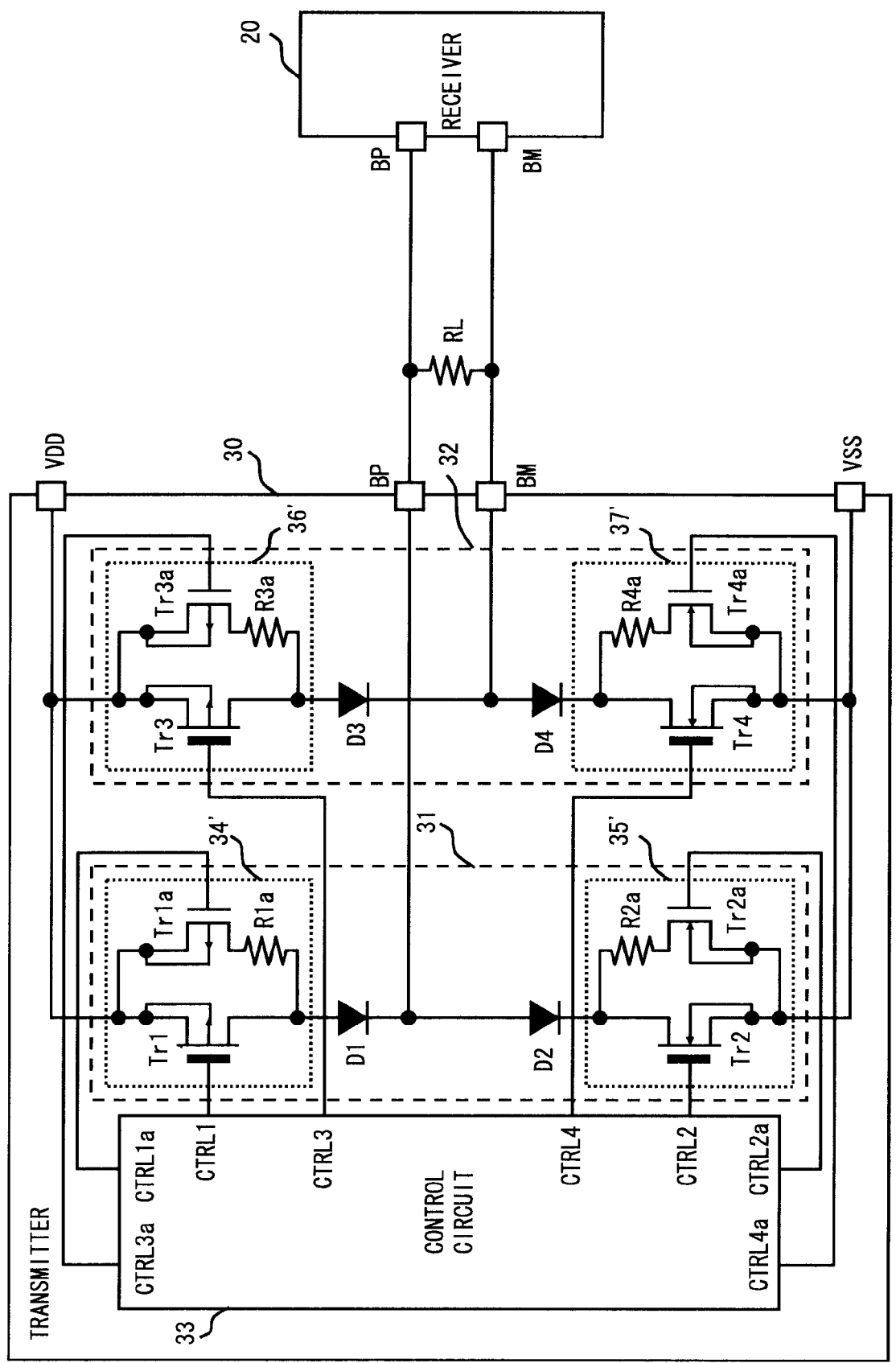
FIG. 7 is a circuit diagram showing another example of the transmitter of the second embodiment.

In the transmitter of the second embodiment, an example of a case in which current-setting resistances are used appears in FIG. 7. In the transmitter 30 shown in FIG. 7, current-adjustment resistances R1a to R4a are connected in series to the respective transistors Tr1a to Tr4a. The current-adjustment resistances R1a to R4a are connected between the transistors to which the resistances are connected and the diodes connected in correspondence to the transistors. The resistance values of the current-adjustment resistances R1a to R4a are larger than the on-resistances of transistors Tr1a to Tr4a, and the through current values are theoretically determined by the sum of the transistor on-resistance value and the resistance value of the current-adjustment resistance, but in actuality are substantially determined by the current-adjustment resistances R1a to R4a.

Figure 8:
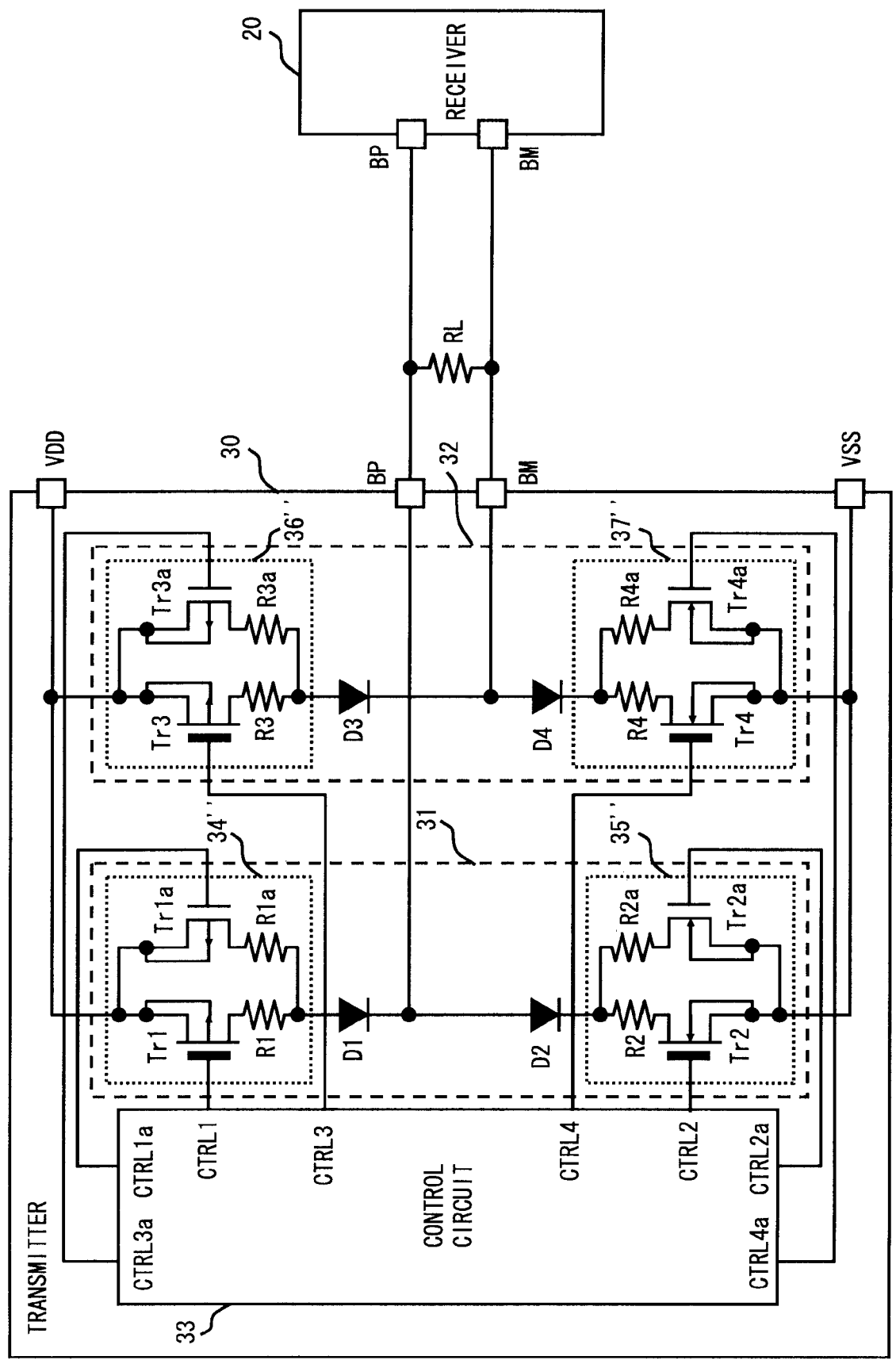
FIG. 8 is a circuit diagram showing another example of the transmitter of the second embodiment.
Figure 9:
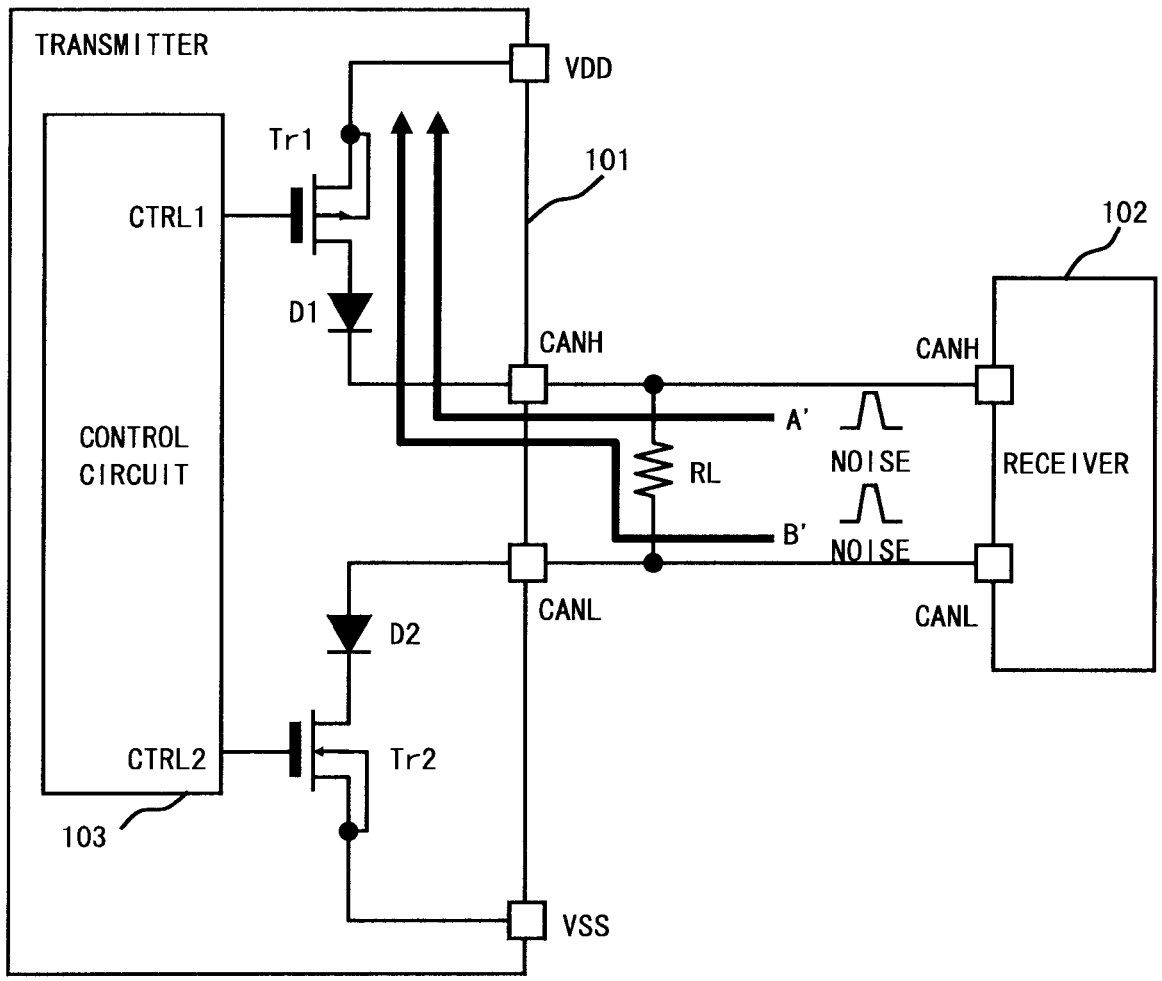
FIG. 9 is a circuit diagram of a transmitter of the related art.
Figure 10:
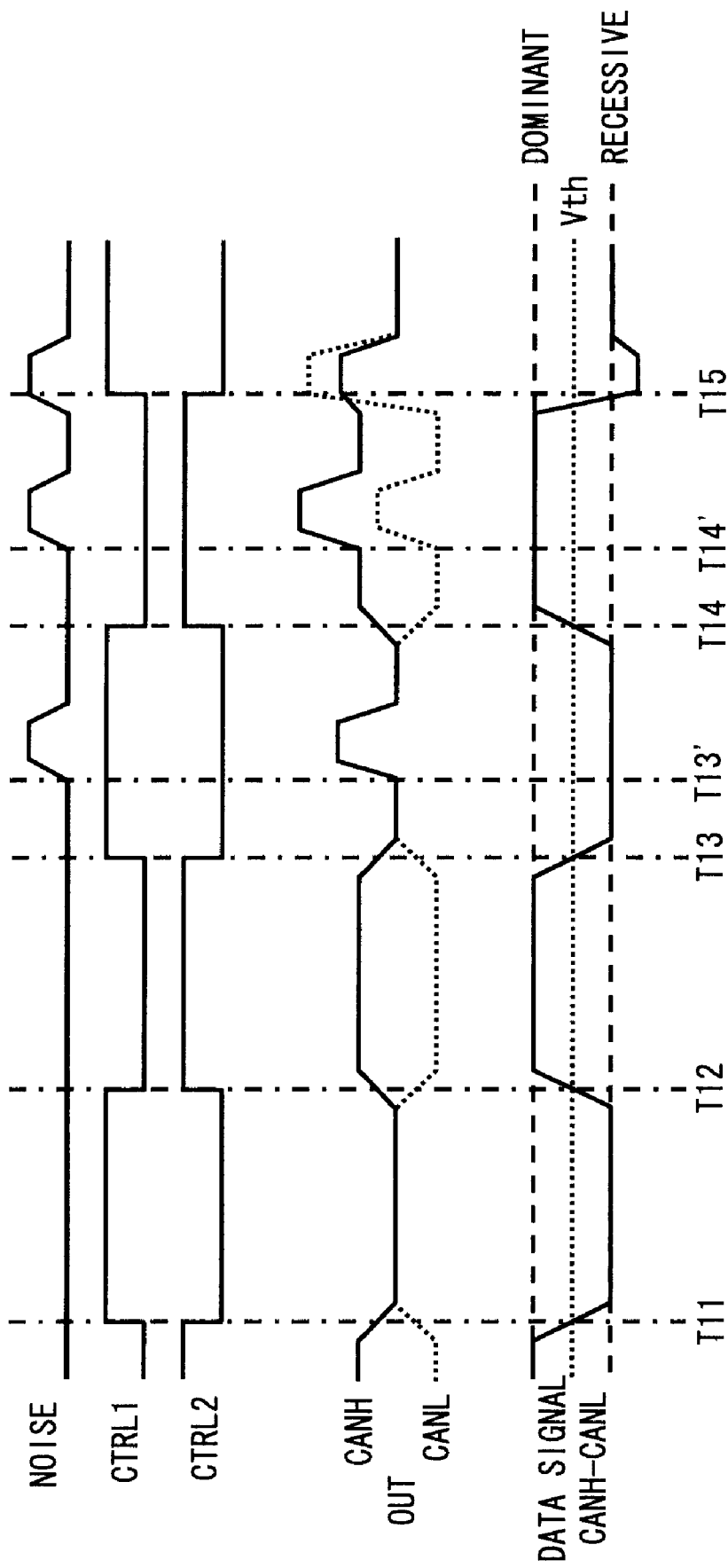
FIG. 10 shows the timing chart of a transmitter of the related art.
Figure 11:
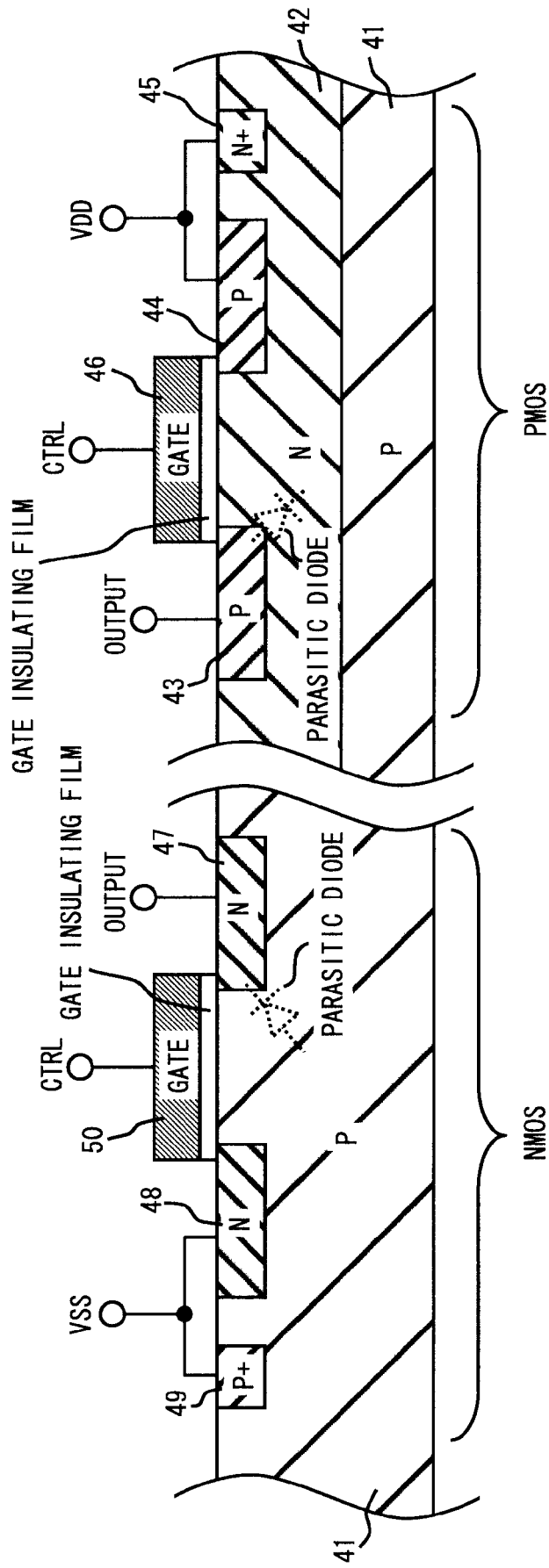
FIG. 11 shows parasitic diodes in a cross-sectional view of widely-used transistors.

Another example of connection of current-adjustment resistances to transistors is shown in FIG. 8. To the transmitter shown in FIG. 7, the transmitter shown in FIG. 8 adds current-adjustment resistances R1 to R4, connected in series to the respective transistors Tr1 to Tr4. The current-adjustment resistances R1 to R4 are connected between the transistors to which the resistances are connected and the diodes connected in correspondence to the transistors. The resistance values of the current-adjustment resistors R1 to R4 are larger than the on-resistances of transistors Tr1 to Tr4. Further, the resistance values of the current-adjustment resistances R1 to R4 are smaller than the resistance values of the current-adjustment resistances R1a to R4a. By this means, when transistors Tr1 to Tr4 are operating, the current amounts flowing in transistors Tr1 to Tr4 are set by the current-adjustment resistances R1 to R4, and the amounts of the through currents are smaller than the currents flowing in transistors Tr1 to Tr4.

It is apparent that the present invention is not limited to the above embodiments, but may be modified and changed without departing from the scope and spirit of the invention. For example, as one example of the method of adjustment of on-resistances of transistors used in the driving circuits, a method in which the gate width is modified, that is, the transistor size is modified, was explained; but of course the on-resistance can also be modified by changing the gate length. Further, the time over which through currents are passed in driving circuits can be modified appropriately according to the diode characteristics.

What is claimed is:

1. A transmitter, comprising:
    first and second driving circuits with reverse-current prevention elements connected between output terminals and power supply terminals; and
    a control circuit which controls the outputs of the first and second driving circuits,
    wherein the control circuit controls the first and second driving circuits, during a transition from a first state in which the first and second driving circuits output a first or a second logic level to a second state in which the first and second driving circuits output an intermediate level between the first and second logic levels, to induce a third state in which a through current flows in the first and second driving circuits via the reverse-current prevention elements.

2. The transmitter according to claim 1, wherein the first and second driving circuits each further include current setting circuits connected in series with the reverse-current prevention elements, and the control circuit controls the first and second driving circuits by controlling the current setting circuits.

3. The transmitter according to claim 2, wherein the current setting circuits each include a transistor and a resistance connected in series with the transistor.

4. The transmitter according to claim 3, wherein the resistance value of the resistance is larger than the on-resistance value of the transistor, and the through current is effectively constrained by the resistance value of the resistance.

5. The transmitter according to claim 2, wherein the current setting circuits each include a first transistor and a second transistor connected in parallel with the first transistor and with a larger on-resistance than the first transistor.

6. The transmitter according to claim 5, wherein the first transistor is in a conducting state in the first and second states and is in a non-conducting state in the third state, and the second transistor is in a conducting state in the third state and is in a non-conducting state in the first and second states.

7. The transmitter according to claim 5, wherein the through current is set based on the value of the on-resistance of the second transistor.

8. The transmitter according to claim 6, wherein the through current is set based on the value of the on-resistance of the second transistor.

9. A transmitter, comprising:
    a first driving circuit in which a first current setting circuit and a first reverse-current prevention element are connected in series between an output terminal and a first power supply and in which a second current setting circuit and a second reverse-current prevention element are connected in series between the output terminal and a second power supply;
    a second driving circuit in which a third current setting circuit and a third reverse-current prevention element are connected in series between an output terminal and the first power supply and in which a fourth current setting circuit and a fourth reverse-current prevention element are connected in series between the output terminal and the second power supply; and
    a control circuit which controls current amounts output by the first through fourth current setting circuits,
    wherein the control circuit controls the first through fourth current setting circuits, during a transition from a first state in which either the first and fourth current setting circuits or the second and third current setting circuits output a current, to a second state in which the first through fourth current setting circuits do not output a current, to induce a third state in which the first through fourth setting circuits output a prescribed current.

10. The transmitter according to claim 9, wherein the resistance value of the resistance is larger than the on-resistance value of the transistor, and the through current is effectively constrained by the resistance value of the resistance.

11. A control method for a transmitter which has: a first driving circuit in which a first current setting circuit and a first reverse-current prevention element are connected in series between an output terminal and a first power supply and in which a second current setting circuit and a second reverse-current prevention element are connected in series between the output terminal and a second power supply; and a second driving circuit in which a third current setting circuit and a third reverse-current prevention element are connected in series between an output terminal and the first power supply and in which a fourth current setting circuit and a fourth reverse-current prevention element are connected in series between the output terminal and the second power supply,
    the control method comprising the step of executing control, during a transition from a first state in which either the first and fourth current setting circuits or the second and third current setting circuits output a current to a second state in which the first through fourth current setting circuits do not output a current, to induce a third state in which the first through fourth current setting circuits output a prescribed current.

* * * * *